United States Patent [19]

Treakle et al.

[11] 4,421,370

[45] Dec. 20, 1983

[54] CONTACT ARRAY

[75] Inventors: Paul W. Treakle, Atkinson; Edward W. Cielakie, Londonderry, both of N.H.

[73] Assignee: Accutest Corporation, Chelmsford, Mass.

[21] Appl. No.: 283,956

[22] Filed: Jul. 16, 1981

[51] Int. Cl.³ .............................................. H01R 9/09
[52] U.S. Cl. ............................. 339/59 M; 339/17 M; 339/DIG. 3
[58] Field of Search ............ 339/17 LM, 17 M, 59 R, 339/59 M, 61 R, 61 M, DIG. 3

[56] References Cited

U.S. PATENT DOCUMENTS

| 3,173,732 | 3/1965 | James | 339/17 LM |
|---|---|---|---|
| 3,680,037 | 7/1972 | Nellis et al. | 339/61 M |
| 4,008,938 | 2/1977 | Anhalt et al. | 339/17 LM |
| 4,027,936 | 6/1977 | Nemoto et al. | 339/59 M |
| 4,050,756 | 9/1977 | Moore | 339/59 M |
| 4,109,378 | 8/1978 | Davies | 39/17 M |

Primary Examiner—John McQuade
Assistant Examiner—Paula Austin
Attorney, Agent, or Firm—Wolf, Greenfield & Sacks

[57] ABSTRACT

The laterally contacting elastomeric array is preferably adapted for use in connecting the pin electronics in a test-head to an electronic device under test. The array comprises a plastic elastomer boat for supporting a plurality of elastomeric contacts, and an insulating thread or filament, or retaining nipples, for supporting the contacts in the elastomer boat. The contacts are each cylindrical, have a hole for receiving the supporting thread (filament) or nipples, and are compressed laterally rather than on their ends.

17 Claims, 6 Drawing Figures

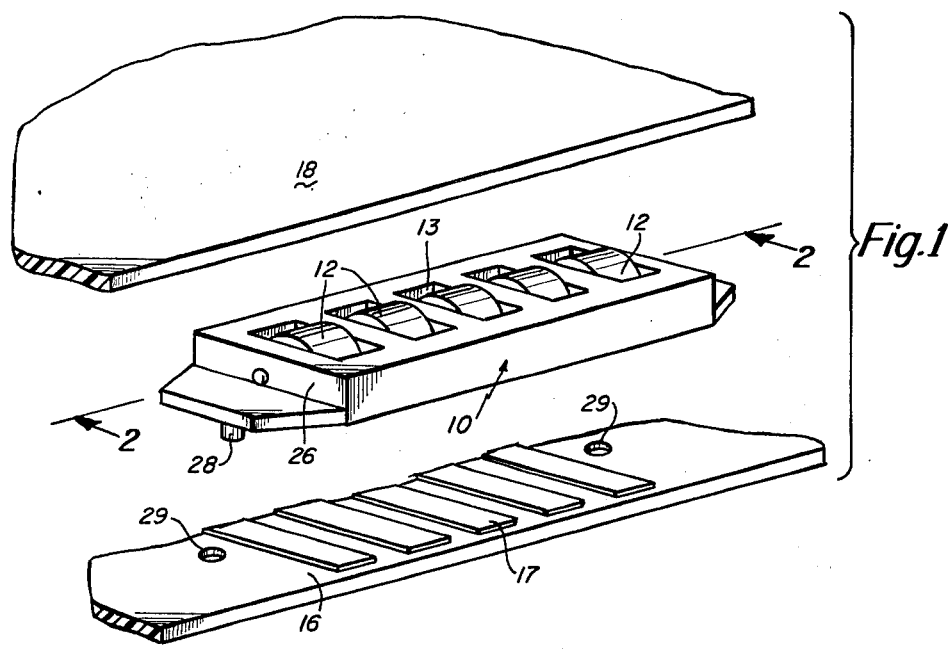
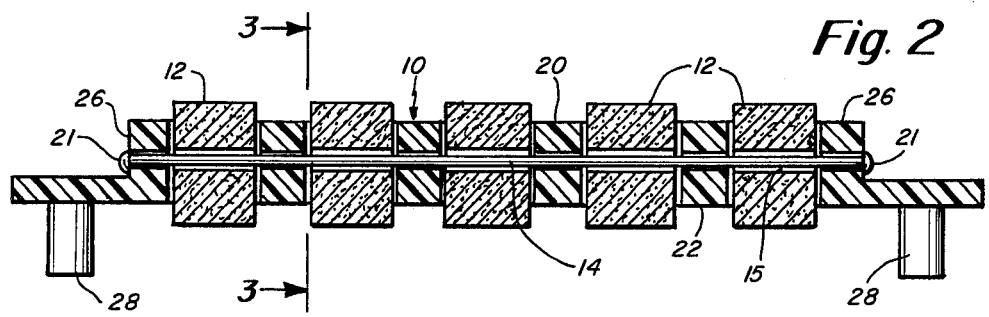
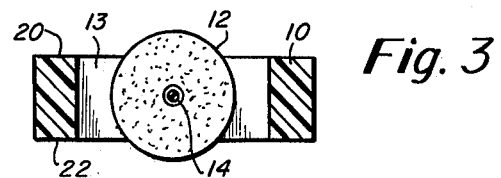
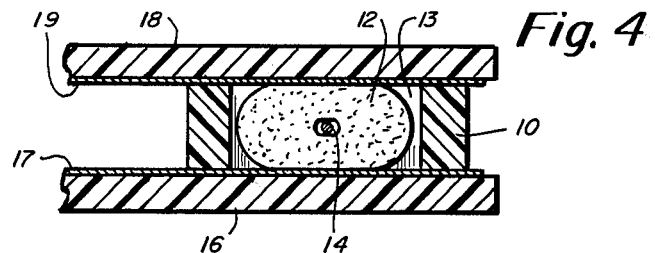

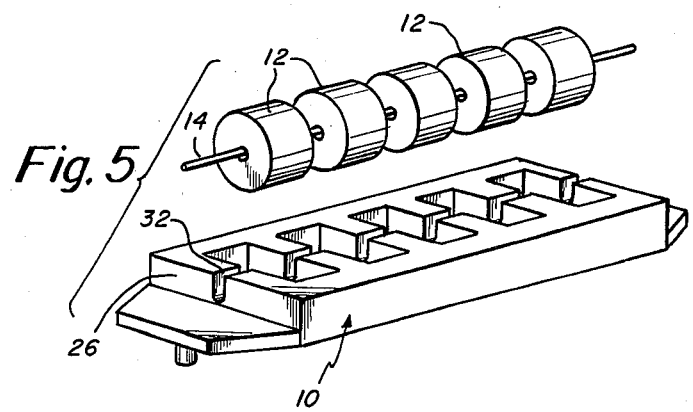
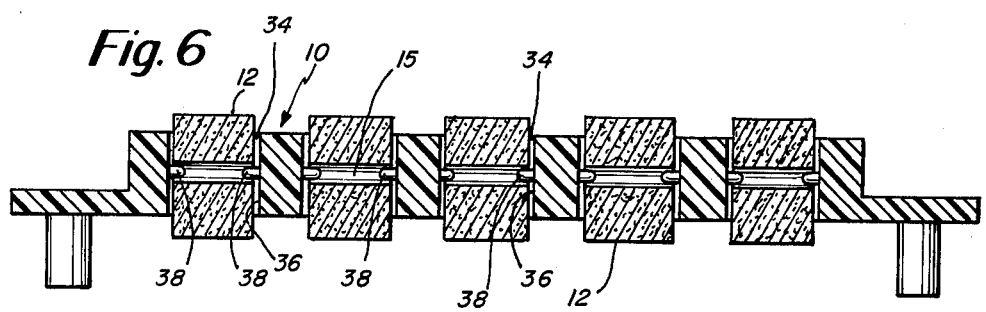

CONTACT ARRAY

BACKGROUND OF THE INVENTION

The present invention relates in general to a contacting array, and pertains more particularly, to a laterally contacting elastomeric array which may be used in one or more groups on the test-head of a test system. In the preferred embodiment the contacting array is used to connect the pin electronics to the individual pins of the device being tested. Usually, the initial contact is made to an interfacing printed circuit load board.

In the past various methods and apparatus have been designed for providing this type of contact. For example, edgeboard connectors have been employed along with other structures such as a metal pin-to-spring receptacle or spring-loaded pressure pins. One common connector employs vertically-compressed solid conductive elastomer cylinders compressed on their flat ends. In systems employing the latter technique problems have developed particularly when it is desired to simultaneously contact a great number of pins such as in access of 800 pins. It has generally been found when employing more than 200 contacts, the pressure required to compress all contactors simultaneously is quite prohibitive with this flat end contact structure.

Another problem with the known connector is the relatively low contact density.

Accordingly, one object of the present invention is to provide a laterally contacting elastomeric array comprising a plurality of contacts and which is characterized by a higher contact density. With the improved laterally contacting method and device of this invention there is a reduction in the space requirement by at least 25% which is a significant improvement in contact density. Furthermore, this is accomplished with no degradation in electrical performance because the contact resistance is still maintained at less than 0.10 ohms per contact.

Another object of the present invention is to provide a laterally contacting elastomeric array that is an improvement over the end contacting array structure. In accordance with the present invention there is provided a partially hollow elastomer cylinder that is compressed and makes contact on its sides rather than on the ends, thus reducing the required pressure to $\frac{1}{4}$ that required for the vertically compressed elastomer.

Still another object of the present invention is to provide an improved contacting elastomeric array that is of relatively simple construction, that is essentially maintenance free, and that can be assembled quite readily.

SUMMARY OF THE INVENTION

To accomplish the foregoing and other objects of this invention there is provided a laterally contacting elastomeric array that comprises an electrically insulating support member preferably in the form of a plastic elastomer boat, and a plurality of elastomeric contacts. The support boat has means for receiving the elastomeric contacts disposed in a spaced array. This receiving means may comprise a plurality of through slots that extend in a linear array. Means are also provided for supporting the elastomeric contacts with each contact being supported in a position permitting limited compressive movement relative to the support member. The elastomeric contact is preferably cylindrical and partially hollow by the provision of an axial passage therethrough to aid in ease of compression of the elastomeric contact and further to accommodate the means for supporting the elastomeric contact in the support member. The support means for the contacts in one embodiment comprises a filament, thread or the like which commonly supports a linear array of contacts by passing through the axial hole in each contact. In an alternate embodiment the filaments may be replaced by retaining nipples that extend partially into the axial hole from opposite sides of the contact. The accommodating slot in the support boat supports the contacts so that they preferably extend both above and below the upper and lower limits of the support bar. The diameter of the hole in the contact is preferably sufficiently large in comparison with the diameter of the filament or other support member so as to provide some limited play between the contact and the support therefor.

BRIEF DESCRIPTION OF THE DRAWINGS

Numerous other objects, features and advantages of the invention should now become apparent upon a reading of the following detailed description taken in conjunction with the accompanying drawing, in which:

FIG. 1 is a exploded perspective view showing the laterally contacting elastomeric array of the present invention;

FIG. 2 is a cross-sectional view taken along lines 2—2 of FIG. 1 longitudinally through the array;

FIG. 3 is a cross-sectional view taken along line 3—3 of FIG. 2 with the contact shown prior to compression;

FIG. 4 is a view similar to that shown in FIG. 3 but with the contact in its compressed condition;

FIG. 5 is a perspective view of an alternate construction, particularly for the elastomer boat; and FIG. 6 is a cross-sectional view similar to that shown in FIG. 2 showing an alternate support for the contacts employing retaining nipples.

DETAILED DESCRIPTION

With reference to the drawings, there is shown in FIGS. 1–4, one embodiment of the laterally contacting elastomeric array of this invention comprising three basic components including a plastic elastomer boat 10, a plurality of elastomeric contacts 12, and an insulating thread or filament 14. FIG. 1 shows the array in an exploded view with relationship to printed circuit boards 16 and 18. The printed circuit boards 16 and 18 have associated therewith a series of conductive strips 17 and 19, respectively.

The elastomer holder or bolt 10 is molded or machined using preferably a rigid thermoplastic material with a volume resistivity of at least $1 \times 10^{14}$ ohm-cm. The holder 10 may be made of lexan. There are disposed in the holder a plurality of slots 13 disposed in a linear array and extending between the top surface 20 and the bottom surface 22 of the holder 10. The height of the holder 10 between surfaces 20 and 22 is smaller than the diameter of the cylindrical elastomeric contacts. FIG. 3 shows this clear difference in dimension. The number of elastomer slots 13 may vary in each array. The elastomeric contact 13 may be cut from a long piece of specific lengths to fit, as indicated in FIG. 2 in each accommodating slot. The elastomeric contact contains conductive material preferably with a volume resistivity of 0.010 ohm-cm. With a length of the contact of on the order of 0.10 inch with a deflection of approximately 0.035 inch against gold-plated printed circuit board etch, there is a contact resistance of 0.100 ohms at a maximum. The complete array described in the drawing is adapted for proper operation over a temperature range of 0°–70° C. at a relative humidity of 50%.

In accordance with one method of assembly, the elastomeric contacts 12 are loaded into the slots 13 of the holder 10 and are captivated by passing a non-conductive rod or filament 14 through all of the central holes 15. As indicated in FIG. 2, the ends 21 of the filament are secured to the upright walls 26 of the holder. The ends may simply be secured by application of heat to weld them to the wall 26. The completed array is placed on the contacting area of the PC board 16 keyed by two alignment stems 28 that are aligned with corresponding holes 29 in the printed circuit board 16. The array may be held in place by two retaining rings (not shown).

FIG. 5 illustrates a preferred boat construction which is substantially the same as the construction depicted in FIGS. 1–4. However, instead of using a through hole for receiving the filament 14, there are provided individual slots 32 which are in alignment and extend longitudinally of the elastomer boat. These slots are sufficiently deep so as to properly align the contacts 12 such as in the position shown in FIG. 2 hereinabove.

The arrangement of FIG. 5 is desirable from a standpoint of ease of assembly. All of the elastomeric contacts 12 may be assembled on the filament 14 totally separate from the boat 10. With the contacts then properly spaced, the assembly of contacts and filament are rested in the boat with the filament 14 resting in the aligned slots 32. In this way the filament does not have to be threaded with the contacts already in the boat. The opposite ends of the filament are easily secured to the end walls 26 by the application of heat such as by the use of a soldering iron which will simply fuse the filament into the wall.

FIG. 6 shows an alternate embodiment for supporting the contacts. Instead of using a filament, thread or the like, the boat is provided with slots 34 for accommodating the elastomeric contacts 12 with the side walls of each slot, such as surface 36 in FIG. 6, being provided with a nipple 38. The diameter of the nipple 38 may be comparable to that of the filament 14 shown in FIG. 2. Thus, each contact 12 is supported on opposite sides by a respective nipple 38 with the nipple extending only preferably a short distance into the elastomeric contact.

Because the contact has sufficient pliability the contacts may be forced over the nipples until the nipples engage with the central hole 15 in each elastomeric contact 12. Once the contacts are in position, they are retained in that position by the nipples but are permitted limited compressive movement, particularly in a vertical direction in FIG. 6 relative to the support means.

Having described one preferred embodiment of the present invention, it should now be apparent that those skilled in the art that numerous modifications may be made in the structure that is described, all of which are contemplated as falling within the scope of this invention. For example, greater or less spacing can be provided between contacts. The length of the slot may be varied so as to accommodate elastomeric contacts of different length depending on the contact resistance that may be required. Also, the plastic material used in the fabrication of the holder 10 may be selected depending upon the inter-contact leakage parameters.

What is claimed is:

1. A contacting elastomeric array comprising;
an electrically insulating support means, comprising a plastic boat having a plurality of vertically extending through slots,
a plurality of electrically conductive elastomeric contacts,
said plastic boat slots for accommodating the elastomeric contacts in a spaced array,
and means supporting the elastomeric contacts in said through slots of the support means with each contact being supported with limited compressive movement relative to the support means, said contacts, each including a substantially cylindrical contact having an axial hole for receiving the means supporting the elastomeric contacts and orienting the contacts for receiving compressive forces against the arcuate sides thereof rather than at flat ends.

2. A contacting elastomeric array as set forth in claim 1 wherein the support means comprises a plastic elastomer boat with the slots extending in a linear array.

3. A contacting elastomeric array as set forth in claim 2 wherein said elastomer boat has a volume resistivity of at least $1 \times 10^{14}$ ohm-cm.

4. A contacting elastomeric array as set forth in claim 3 wherein said elastomer boat is lexan.

5. A contacting elastomeric array as set forth in claim 1 wherein each elastomeric contact extends above and below the support means.

6. A contacting elastomeric array as set forth in claim 1 wherein the means supporting the plurality of electrically conductive elastomeric contacts includes filament or the like means commonly supporting the contacts by passing through the axial hole in each contact.

7. A contacting elastomeric array as set forth in claim 6 wherein the diameter of the hole in the contact is sufficiently larger than the filament diameter to provide limited play of the contact within the support means.

8. A contacting elastomeric array as set forth in claim 1 wherein each elastomeric contact has a volume resistivity on the order of 0.010 ohm-cm.

9. A contacting elastomeric array as set forth in claim 1 wherein each elastomeric contact has a contact resistance of 0.100 ohms at a maximum.

10. A contacting elastomeric array comprising;
an electrically insulating support means,
a plurality of electrically conductive elastomeric contacts,
said support means having means for receiving the elastomeric contacts in a spaced array,
and means supporting the elastomeric contacts in the receiving means of the support means with each contact being supported with limited compressive movement relative to the support means,
wherein the support means comprises a plastic boat having a plurality of through slots for accommodating the contacts, the slots extending vertically through the plastic boat and disposed in an array, said contacts each including a substantially cylindrical contact having an axial hole for receiving a filament means forming the means for supporting the contacts to orient the contacts for receiving compressive forces against the arcuate sides thereof rather than at flat ends.

11. A contacting elastomeric array comprising;
an electrically insulating support means,
a plurality of electrically conductive elastomeric contacts, said support means having means for receiving the elastomeric contacts in a spaced array, and means supporting the elastomeric contacts in the receiving means of the support means with each contact being supported with limited compressive movement relative to the support means wherein the means supporting the contacts includes oppositely disposed nipples extending from opposite directions into ends of an axial hole in each contact.

12. A contacting elastomeric array as set forth in claim 11 wherein the diameter of the hole in the contact is sufficiently larger than the nipple diameter to provide limited play of the contact within the support means.

13. A contacting elastomeric array comprising;
an electrically insulating support means,
a plurality of electrically conductive elastomeric contacts,
said support means having means for receiving the elastomeric contacts in a spaced array,
and means supporting the elastomeric contacts in the receiving means of the support means with each contact being supported with limited compressive movement relative to the support means
wherein the means supporting the contacts includes filament or the like means commonly supporting the contacts and being accommodated in linear slots in the support means whereby all contacts may be fitted on the filament prior to introduction into the received means.

14. An elastomeric contact comprising,
an electrically insulating support body, at least one electrically conductive elastomeric contact of cylindrical shape thus having substantially flat ends and a circumferential surface and having a substantially axially disposed hole extending between the flat ends, and means associated with the support body extending at least partially into said axial hole and for retaining the contact in a laterally contacting position with the circumferential surface at least in part exposed from the support body for receiving compressive forces thereagainst, said support body having a plurality of spacedly disposed slots for accommodating respective elastomeric contacts and said means for retaining including means supporting each contact in its accommodating slot in a manner whereby the contact is at least partially free-floating relative to the support body.

15. An elastomeric contact as set forth in claim 14 wherein the means for retaining provides separate and isolated support for each contact.

16. An elastomeric contact as set forth in claim 15 wherein the means for retaining provides support at each contact absent interaction with an adjacent contact.

17. An elastomeric contact as set forth in claim 14 wherein the free floating provides limited play of the contact within the support body.

* * * * *